(12) United States Patent
Jiang et al.

(10) Patent No.: US 12,399,198 B1
(45) Date of Patent: Aug. 26, 2025

(54) ZERO-CROSSING DETECTION CIRCUIT

(71) Applicant: Montage Technology, Inc., San Jose, CA (US)

(72) Inventors: Jiandong Jiang, San Jose, CA (US); Xuexin Ding, Shanghai (CN)

(73) Assignee: Montage Technology, Inc., San Jose, CA (US)

( * ) Notice: Subject to any disclaimer, the term of this patent is extended or adjusted under 35 U.S.C. 154(b) by 38 days.

(21) Appl. No.: 18/624,134

(22) Filed: Apr. 2, 2024

(51) Int. Cl.
*G01R 19/175* (2006.01)
*G01R 19/18* (2006.01)
*H02M 1/00* (2006.01)

(52) U.S. Cl.
CPC .......... *G01R 19/175* (2013.01); *G01R 19/18* (2013.01); *H02M 1/0058* (2021.05)

(58) Field of Classification Search
CPC .............................. G01R 19/175; G01R 19/18
USPC .......................................................... 327/79
See application file for complete search history.

(56) References Cited

U.S. PATENT DOCUMENTS 9,444,321 B2 * 9/2016 Xu ..................... G01R 19/175

OTHER PUBLICATIONS

Vratislav Michal, "Inductor Current Zero-Crossing Detector and CCM/DCM Boundary Detector for Integrated High-Current Switched-Mode DC-DC Converters", IEEE Transactions on Power Electronics, Nov. 25, 2013, pp. 5384-5391.

* cited by examiner

*Primary Examiner* — Tomi Skibinski
(74) *Attorney, Agent, or Firm* — JCIPRNET

(57) ABSTRACT

A zero-crossing detection circuit includes a variable resistor, a first switch, a first capacitor, a first selector, a second selector, a first transistor, and a comparator. Variable resistor is connected to power supply voltage via reference resistor. First switch has first terminal coupled to first terminal of variable resistor. First capacitor has first terminal coupled to second terminal of first switch. First selector makes second terminal of first capacitor receive switching voltage or reference ground voltage according to first control signal. First transistor has first terminal coupled to second terminal of variable resistor. Second terminal of first transistor receives reference ground voltage. Second selector couples control terminal of first transistor to first terminal of first transistor or to first terminal of first capacitor according to first control signal. Comparator compares voltage on second terminal of variable resistor with reference voltage to generate final zero-crossing detection output signal.

15 Claims, 5 Drawing Sheets

ZERO-CROSSING DETECTION CIRCUIT

BACKGROUND OF THE INVENTION

Field of the Invention

The invention relates to a zero-crossing detection circuit, and in particular to a zero-crossing detection circuit of a Switch Mode Power Supply (SMPS) DC-DC voltage converter.

Description of Related Art

Various zero-crossing detection techniques for voltage converters have been proposed in the prior art. However, these techniques require accurate comparators to perform zero-crossing detection actions. If the delay time between the occurrence of a true zero-current event and the activation of a zero-crossing detection signal that may be used to control the power switching stage (power stage) (also called "zero-crossing detection delay") is considered, direct zero-current event detection does not allow control of the power switch at the true zero-crossing moment. Moreover, the zero-crossing detection delay is changed with changes in factors such as process, voltage, temperature. However, the existing method of combining a preset zero-crossing threshold with a detection delay may further reduce the accuracy of zero-crossing detection.

Therefore, it is desired to provide a zero-crossing detection circuit that effectively reduces the zero-crossing detection delay and other errors.

SUMMARY OF THE INVENTION

The invention is directed to a zero-crossing detection circuit that may effectively reduce the detection delay of the zero-crossing point.

According to an embodiment of the invention, a zero-crossing detection circuit includes a variable resistor, a first switch, a first capacitor, a first selector, a second selector, a first transistor, and a comparator. The variable resistor has a first terminal to be connected to a power supply voltage via a reference resistor. The first switch has a first terminal coupled to a first terminal of the variable resistor. The first capacitor has a first terminal coupled to a second terminal of the first switch. The first selector makes a second terminal of the first capacitor receive a switching voltage or a reference ground voltage according to a first control signal. The first transistor has a first terminal coupled to a second terminal of the variable resistor, and a second terminal of the first transistor receives the reference ground voltage. The second selector couples a control terminal of the first transistor to the first terminal of the first transistor or to the first terminal of the first capacitor according to the first control signal. The comparator compares a voltage on the second terminal of the variable resistor with a zero-crossing detection reference voltage to generate a final zero-crossing detection output signal.

DESCRIPTION OF THE EMBODIMENTS

Figure 1:
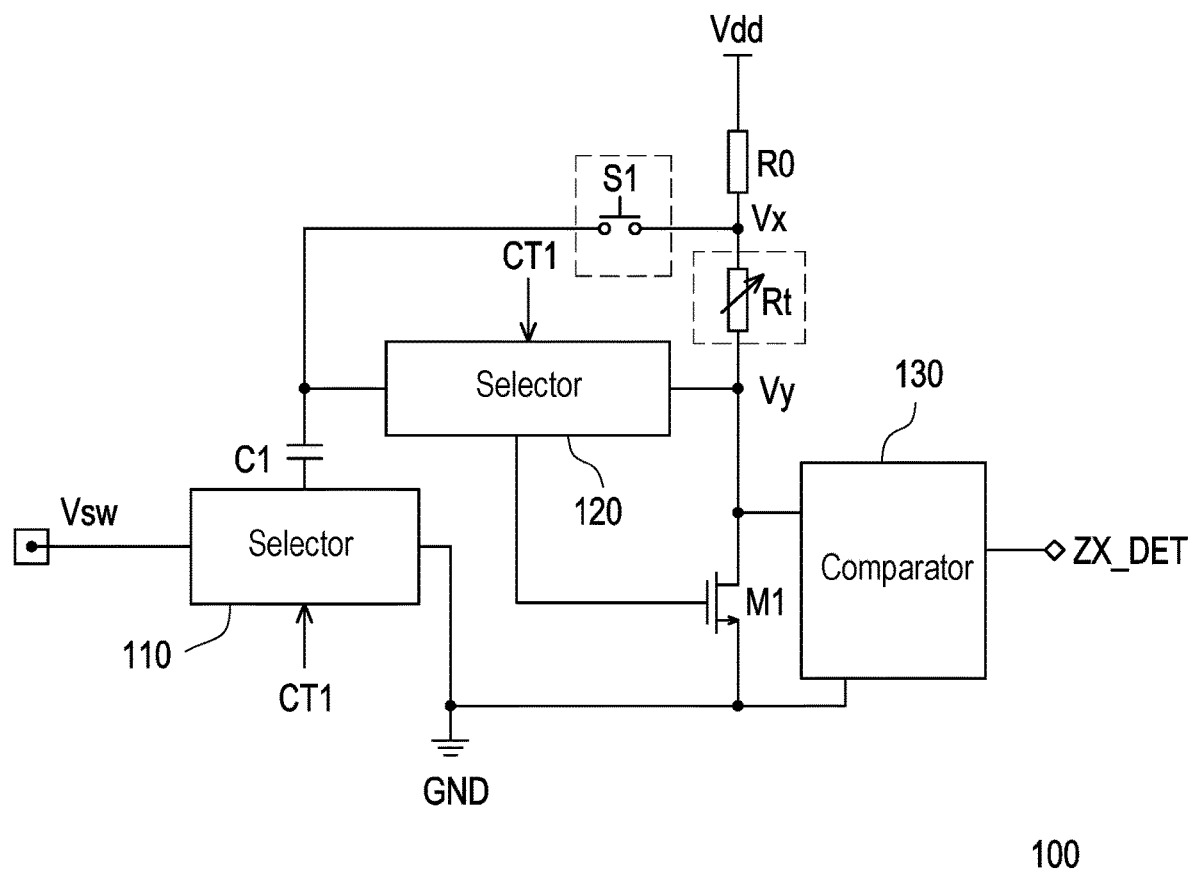
FIG. 1 is a block diagram of a zero-crossing detection circuit of an embodiment of the invention.

Reference will now be made in detail to the exemplary embodiments of the invention, examples of which are illustrated in the accompanying drawings. Wherever possible, the same reference numerals are used in the figures and the descriptions to refer to the same or similar portions.

Referring to FIG. 1, FIG. 1 is a block diagram of a zero-crossing detection circuit of an embodiment of the invention. A zero-crossing detection circuit 100 includes a variable resistor Rt, a switch S1, selectors 110 and 120, a comparator 130, and a transistor M1. A first terminal of the variable resistor Rt is connected to a power supply voltage Vdd through a reference resistor R0. A terminal of the switch S1 is coupled to a coupling terminal of the reference resistor R0 and the variable resistor Rt, and another terminal of the switch S1 is coupled to a first terminal of a capacitor C1. The second terminal of the capacitor C1 is coupled to the selector 110. The selector 110 is also connected to a ground GND to receive a reference ground voltage $V_{GND}$ and connected to an output terminal (SW) of a power transistor of a voltage converter to receive a switching voltage $V_{SW}$. The selector 120 is coupled between the first terminal of the capacitor C1 and a second terminal of the variable resistor Rt, and the selector 120 is further coupled to a control terminal of the transistor M1. The first terminal of the transistor M1 is coupled to the second terminal of the variable resistor Rt, and the second terminal of the transistor M1 receives the reference ground voltage $V_{GND}$. In addition, the comparator 130 is coupled to the first terminal of the transistor M1 and also receives the reference ground voltage $V_{GND}$. In an embodiment, the comparator 130 may include an operational amplifier, the control terminal of the transistor M1 is a gate, the first terminal thereof is a drain, and the second terminal thereof is a source.

The selectors 110 and 120 receive a control signal CT1. According to the control signal CT1, the selector 110 may make the second terminal of the capacitor C1 receive the switching voltage $V_{SW}$ or the reference ground voltage $V_{GND}$, and the selector 120 may couple the control terminal of the transistor M1 to the first terminal of the transistor M1 or to the first terminal of the capacitor C1. In particular, the switching voltage $V_{SW}$ comes from the output terminal of the power transistor of the voltage converter. Specifically, in the first control phase, the selector 110 may make the second terminal of the capacitor C1 receive the reference ground voltage $V_{GND}$, and the selector 120 may couple the control terminal of the transistor M1 to the first terminal of the transistor M1, and the switch S1 may be turned on. Moreover, in the second control phase, the selector 110 may make the second terminal of the capacitor C1 receive the switching voltage $V_{SW}$, and the selector 120 may couple the control terminal of the transistor M1 to the first terminal of the capacitor C1, and the switch S1 may be cut off. In the present embodiment, the first control phase and the second control phase may occur alternately.

Furthermore, in the first control phase, the first terminal of the capacitor C1 receives an operating voltage Vx via the switch S1, and the second terminal of the capacitor C1 receives the reference ground voltage $V_{GND}$ via the selector 110. At this time, the capacitor C1 may be charged up to the operating voltage Vx.

Moreover, in the first control phase, the control terminal of the transistor M1 is coupled to the first terminal thereof and forms a diode connection configuration, and the comparator 130 is configured as a voltage buffer. Therefore, a gate-source voltage Vgs_p1 of the first-stage transistor M1 is equal to a drain-source voltage Vds thereof. At this time, a drain-source current $I_D$ of the transistor M1 is equal to:

$$I_D = \frac{Vdd - Vgs}{R0 + Rt} = \frac{1}{2}\mu_n C_{OX} \frac{W}{L}(Vgs - Vtn)^2 \quad (1)$$

wherein R0 is a resistance value of the reference resistor R0, Rt is a resistance value of the variable resistor Rt, $\mu_n$ is an electron mobility of the N-type metal oxide semi-field effect transistor (NMOS), $C_{OX}$ is an oxide capacitance per unit area of the transistor M1, Vtn is a conduction threshold voltage of the transistor M1, L is the channel length of the transistor M1, and W is the channel width of the transistor M1.

According to the current $I_D$, the mathematical formula of a voltage Vy on the first terminal of the transistor M1 may be calculated as:

$$Vy = \text{Vgs\_p1} = Vds = \sqrt{\frac{2I_D \times L}{\mu_n C_{OX} W}} + Vtn \quad (2)$$

Furthermore, the mathematical formula of the voltage Vx may be calculated as:

$$Vx = Vy + I_D \times Rt = \sqrt{\frac{2I_D \times L}{\mu_n C_{OX} W}} + Vtn + I_D \times Rt \quad (3)$$

wherein in the first control phase, the voltage on the first terminal of the capacitor C1 may be charged to be equal to the voltage Vx. It should be mentioned that, in an embodiment of the present application, the capacitor C1 is decided to be charged to the voltage Vx in the first stage, and may flexibly set the zero-crossing detection reference voltage to an optimal positive value, and has the ability to track changes in the switching voltage $V_{SW}$. Moreover, in the first stage of the comparator 130, the zero-crossing detection reference voltage may be generated according to the voltage Vy on the first terminal of the transistor M1 at this time, that is, at this time, the comparator 130 is configured as a voltage buffer for generating a zero-crossing detection reference voltage according to the voltage Vy (=Vgs_p1) on the first terminal of the first-stage transistor M1. The details of the zero-crossing detection reference voltage generated by the comparator 130 are described in more detail in later embodiments. It should be mentioned that, this zero-crossing detection reference voltage includes an input bias error voltage Vos of the comparator 130 that is automatically eliminated in a subsequent comparison, thus reducing the requirements for the design accuracy of the zero-crossing detection comparator. Therefore, smaller input device sizes may be used with reduced parasitics to improve the response speed of the comparator.

In the second stage, the second terminal of the capacitor C1 receives the switching voltage $V_{SW}$, the switch S1 is cut off, and the first terminal of the capacitor C1 is changed to be coupled to the control terminal of the transistor M1. Accordingly, the capacitor C1 can sense the voltage value of the switching voltage $V_{SW}$, and provide a corresponding voltage to the control terminal (gate) of the transistor M1 according to the change of the switching voltage $V_{SW}$. The transistor M1 is, at this time, configured as a common-source amplifier having a resistive load, and provides, for example, a gain of 30 dB, wherein when the switching voltage $V_{SW}$ is the negative voltage before the zero-crossing point, the relevant mathematical formula may be as follows:

$$I_D \times Rt + V_{SW} < 0 \quad (4)$$

A voltage Vc1 on the first terminal of the capacitor C1 may be expressed as:

$$Vc1 = Vgs = \sqrt{\frac{2I_D \times L}{\mu_n C_{OX} W}} + Vtn + I_D \times Rt + Vsw < \text{Vgs\_p1} \quad (5)$$

It may be seen that at this time, the voltage Vy on the first terminal of the transistor M1 received by the comparator 130 is higher than that in the first stage.

Furthermore, when the switching voltage $V_{SW}$ is a positive voltage after passing the zero-crossing point, the relevant mathematical formula may be as follows:

$$I_D \times Rt + Vsw \geq 0$$

$$Vc1 = Vgs = \sqrt{\frac{2I_D \times L}{\mu_n C_{OX} W}} + Vtn + I_D \times Rt + Vsw \geq \text{Vgs\_p1}$$

It may be seen that at this time, the voltage Vy on the first terminal of the transistor M1 received by the comparator 130 may be lower than that in the first stage.

That is, the comparator 130 may effectively detect the zero-crossing point of the switching voltage $V_{SW}$ by comparing the voltage Vy on the first terminal of the transistor M1 with the zero-crossing detection reference voltage (approximately equal to Vgs_p1). The comparator 130 may generate a final zero-crossing detection output signal ZX_DET based on the comparison result.

More specifically, according to the above mathematical formula, based on the relationship between the second-stage voltage Vc1 and the gate-source voltage Vgs_p1 of the first-stage transistor M1, it may be known that, by adjusting the resistance value of the variable resistor Rt, the zero-crossing detection reference voltage may be flexibly controlled to adjust the trip point of the zero-crossing point of the detected switching voltage $V_{SW}$. Specifically, by adjusting the resistance value of the variable resistor Rt, the zero-crossing point of the switching voltage $V_{SW}$ is detected early, and the time delay of the final zero-crossing detection output signal ZX_DET being output to the external circuit may be effectively compensated, thereby improving the accuracy of zero-crossing detection. Moreover, the zero-crossing detection error caused by process parameter drift and environmental factor variation may also be compensated by adjusting the resistance value of the variable resistor Rt, thereby improving the accuracy of zero-crossing detection.

Figure 2:
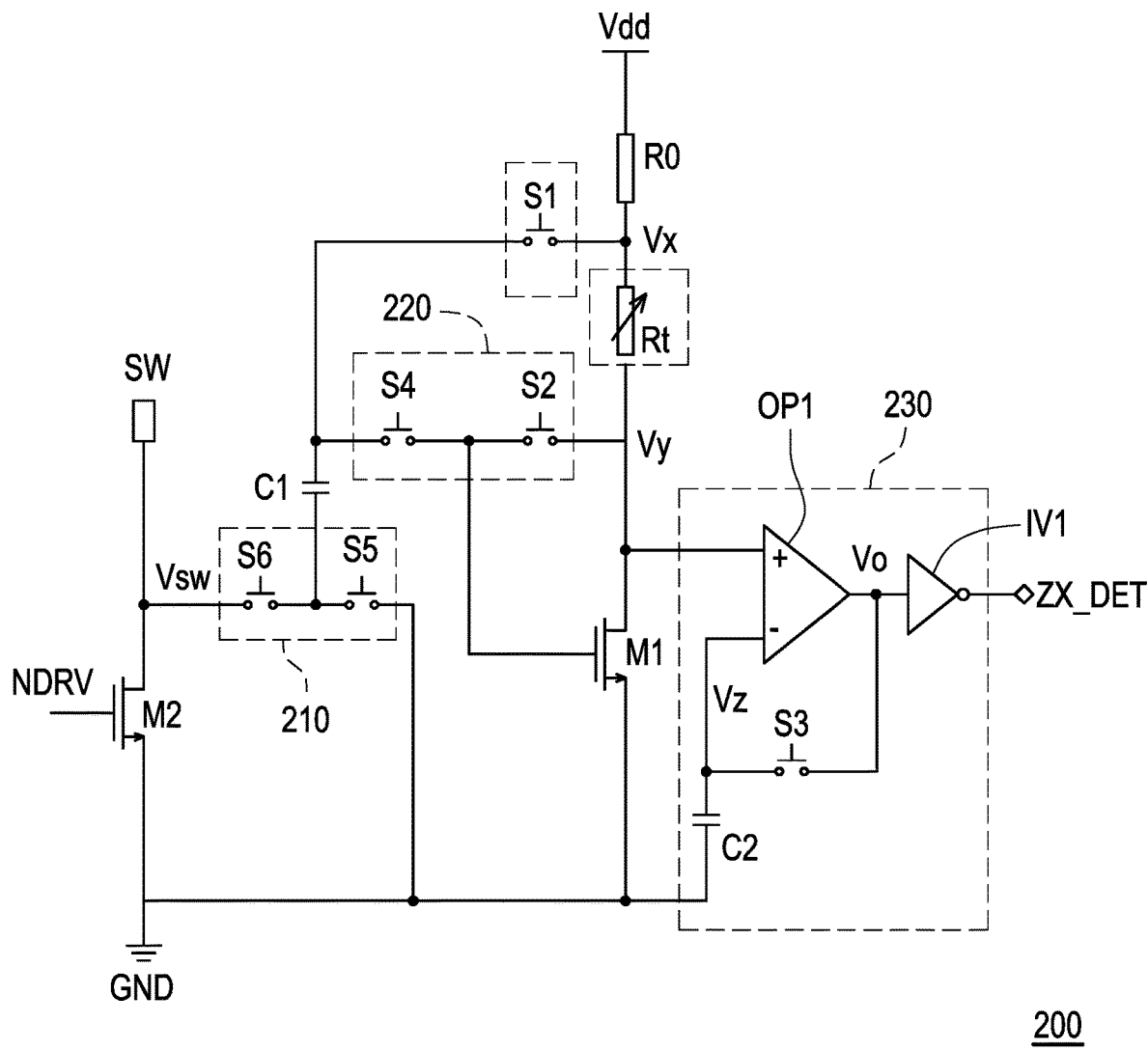
FIG. 2 is a circuit diagram of a zero-crossing detection circuit of an embodiment of the invention.

Referring to FIG. 2, FIG. 2 is a circuit diagram of a zero-crossing detection circuit of an embodiment of the invention. A zero-crossing detection circuit 200 includes the variable resistor Rt, the switch S1, selectors 210 and 220, a comparator 230, and the transistor M1. The selector 210 includes switches S5 and S6. The switch S6 is coupled between the second terminal of the capacitor C1 and an output terminal SW of a power transistor M2 of the voltage converter. The switch S5 is coupled between the second terminal of the capacitor C1 and the ground GND. The selector 220 includes switches S2 and S4. The switch S2 is coupled between the first terminal of the transistor M1 and the control terminal thereof. The switch S4 is coupled between the control terminal of the transistor M1 and the first terminal of the capacitor C1. In particular, in the first control phase, the switches S6 and S4 are shut off, and the switches S1, S5, and S2 are turned on. In the second control phase, the switches S6 and S4 are turned on and the switches S1, S5, and S2 are shut off. The control terminal of the power transistor M2 is used to receive a driving signal NDRV and is controlled by the driving signal NDRV.

In addition, the comparator 230 includes an operational amplifier OP1, a switch S3, a capacitor C2, and an inverter IV1. The positive input terminal of the operational amplifier OP1 is coupled to the first terminal of the transistor M1, and the negative input terminal of the operational amplifier OP1 is coupled to the first terminal of the capacitor C2. The negative input terminal of the operational amplifier OP1 is coupled to the output terminal of the operational amplifier OP1 via the switch S3. The output terminal of the operational amplifier OP1 may also be coupled to the inverter IV1. The second terminal of capacitor C2 receives the reference ground voltage $V_{GND}$. Operationally, in the first control phase, the switch S3 is turned on. The operational amplifier OP1 forms a voltage buffer. At this time, a voltage Vz on the first terminal of the capacitor C2 equals to the sum of the voltage on the first terminal of the transistor M1 and the offset error voltage Vos between the input terminals of the operational amplifier OP1 (=Vy+Vos), wherein the voltage Vz is the zero-crossing detection reference voltage.

In the second control phase, the switch S3 may be shut off, and the operational amplifier OP1 may form a comparator and generate a comparison result Vo by comparing the voltage Vy in the second control phase with the zero-crossing detection reference voltage Vz. Further, via the inverter IV1, the comparator 230 may generate the final zero-crossing detection output signal ZX_DET. In the present embodiment, the inverter IV1 may be a Schmitt trigger or an inverter having an input terminal as an N-type transistor (NMOSFET) and a load as a resistor/current source.

It is worth mentioning that in other embodiments of the invention, the inverter IV1 is not a necessary member. After flipping the logic polarity of the comparator output, the comparator 230 may also indirectly translate the comparison result Vo as the final zero-crossing detection output signal ZX_DET without certain restrictions.

Incidentally, the switches S1 to S6 in the present embodiment may be any switch components known to those of ordinary skill in the art, such as transistor switches, without certain restrictions.

Figure 3:
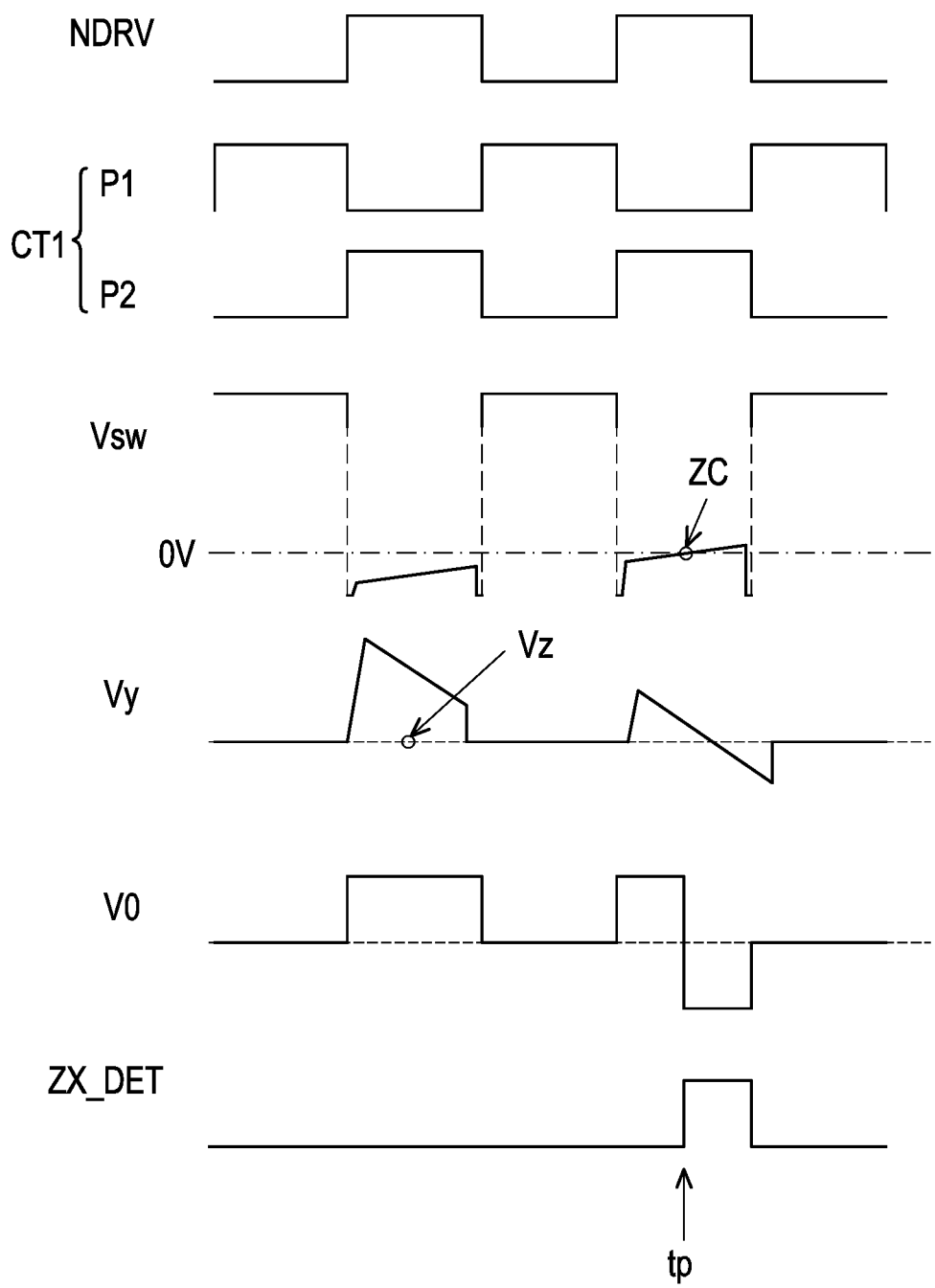
FIG. 3 is an action waveform graph of a zero-crossing detection circuit of an embodiment of the invention.

Please refer to FIG. 3. FIG. is an operation waveform diagram of a zero-crossing detection circuit of an embodiment of the invention. Correspondingly referring to FIG. 2, the power transistor M2 is controlled by the periodically switched driving signal NDRV. Corresponding to the driving signal NDRV, the control signal CT1 includes sub-control signals P1 and P2. The sub-control signals P1 and P2 have complementary phases and are switched periodically. The sub-control signals P1 and P2 may be used to define whether the zero-crossing detection circuit 200 is in the first control phase or the second control phase. When the sub-control signal P1 is a high logic value and the sub-control signal P2 is a low logic value, the zero-crossing detection circuit 200 is in the first control phase. When the sub-control signal P2 is a high logic value and the sub-control signal P1 is a low logic value, the zero-crossing detection circuit 200 is in the second control phase.

Corresponding to the switching action of the power transistor M2, the voltage converter may generate the switching voltage $V_{SW}$. The switching voltage $V_{SW}$ may maintain a high voltage value in the first control phase, and switch to a voltage value less than 0 V in the second stage. The zero-crossing detection circuit 200 of the present embodiment is used in the second stage to detect whether the voltage value of the switching voltage $V_{SW}$ crosses the 0-voltage point from a negative voltage, and to detect a zero-crossing point ZC. In particular, FIG. 3, the zero-crossing detection circuit 200 detects the zero-crossing point ZC by comparing the voltage Vy with the voltage Vz (reference voltage) on the capacitor C2 at a moment tp. In particular, the zero-crossing point ZC may be detected when the detection voltage Vy is changed from greater than the zero-crossing detection reference voltage Vz to less than the zero-crossing detection reference voltage Vz.

In the present embodiment, in the second control phase, when the voltage Vy is greater than the voltage Vz, the comparator 230 may generate the comparison result Vo that is a positive voltage value. In contrast, in the second control phase, when the voltage Vy is less than the voltage Vz, the comparator 230 may generate the comparison result Vo that is at voltage level close to ground potential of the comparator. In the first control phase, the comparator 230 actually forms one voltage buffer, and the resulting output is equal to the sum of the voltage on the first terminal of the transistor M1 and the offset error voltage Vos between the input terminals of the operational amplifier OP1 (=Vy+Vos). Therefore, the trip threshold of the inverter IV1 should be close to the NMOS conduction threshold value; or an NOR logic gate can be used such that the zero-crossing detection output is disabled during the first phase, while the operational amplifier is configured as a voltage buffer. Once the memory operation is complete, the inverter IV1 may generate the final zero-crossing detection output signal ZX_DET according to the comparison result Vo in the second control phase. In particular, in the present embodiment, the final zero-crossing detection output signal ZX_DET is pulled up to a high logic value at the moment tp.

In the present embodiment, the plurality of switches S1 to S6 work together, and under the control of the first sub-control signal P1, the comparator 230 generates a zero-crossing detection reference voltage and stores the zero-crossing detection reference voltage on the second capacitor C2; under the control of the second sub-control signal P2, the comparator determines whether the zero-crossing detection reference voltage crosses zero, thus having the characteristics of high speed, adjustability, accuracy, and reliability.

Figure 4:
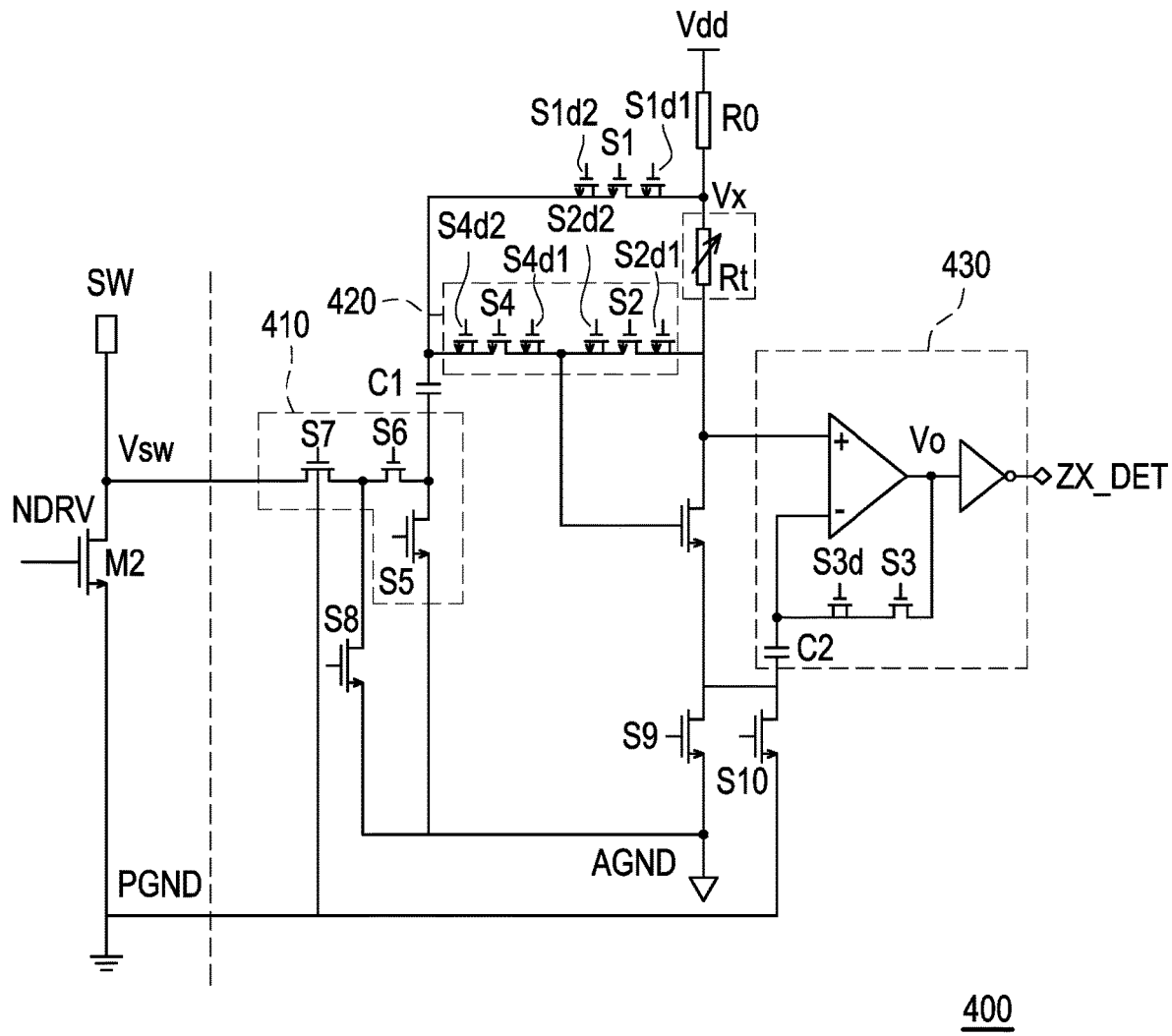
FIG. 4 is a circuit diagram of a zero-crossing detection circuit of another embodiment of the invention.

Referring to FIG. 4 below, FIG. 4 is a circuit diagram of a zero-crossing detection circuit of another embodiment of the invention. A zero-crossing detection circuit 400 includes the variable resistor Rt, the switch S1, selectors 410 and 420, a comparator 430, the transistor M1, and switches S8 to S10. The zero-crossing detection circuit 400 of FIG. 4 has a similar circuit structure to the zero-crossing detection circuit 200 of FIG. 2. What is different from the embodiment of FIG. 2 is that in the present embodiment, the selector 410 also includes a switch S7 in addition to the switches S5 and S6. The switch S7 is provided between the path through which the switch S5 receives the switching voltage $V_{SW}$. Since the voltage of the switching voltage $V_{SW}$ is more special, the switching voltage $V_{SW}$ may be as high as the input voltage of the power converter or lower than 0 V. Therefore, the switches S6 and S7 need to adopt high-voltage-resistant devices and the connection potential of the substrate also needs to be considered. Moreover, two redundant switches S1d1 and S1d2 may be disposed at two sides of the switch S1, and two redundant switches S4d1, S4d2, S2d1, and S2d2 may also be respectively disposed at two sides of the switches S4 and S2 in the selector 420 to similarly reduce the channel charge redistribution effect and control signal leakage charge loss during the switching process of the switches S1, S4, and S2.

In the present embodiment, the zero-crossing detection circuit 400 also includes the switches S8, S9, and S10. In particular, the switch S8 is coupled between the first terminal of the switch S6 and a reference ground terminal AGND; the switch S9 is coupled between the second terminal of the capacitor C2 and the reference ground terminal AGND; and the switch S10 is coupled between the second terminal of the capacitor C2 and a reference ground terminal PGND. In particular, the reference ground terminal AGND is a ground terminal belonging to the zero-crossing detection circuit 400, and the reference ground terminal PGND is the high-current power ground terminal of a DC-DC voltage converter. In particular, the switches S8 to S9 are turned on in the first stage and cut off in the second stage. The switch S10 is shut off in the first stage and turned on in the second stage.

In the present embodiment, the switches S1 to S10 may all be transistor switches.

Figure 5:
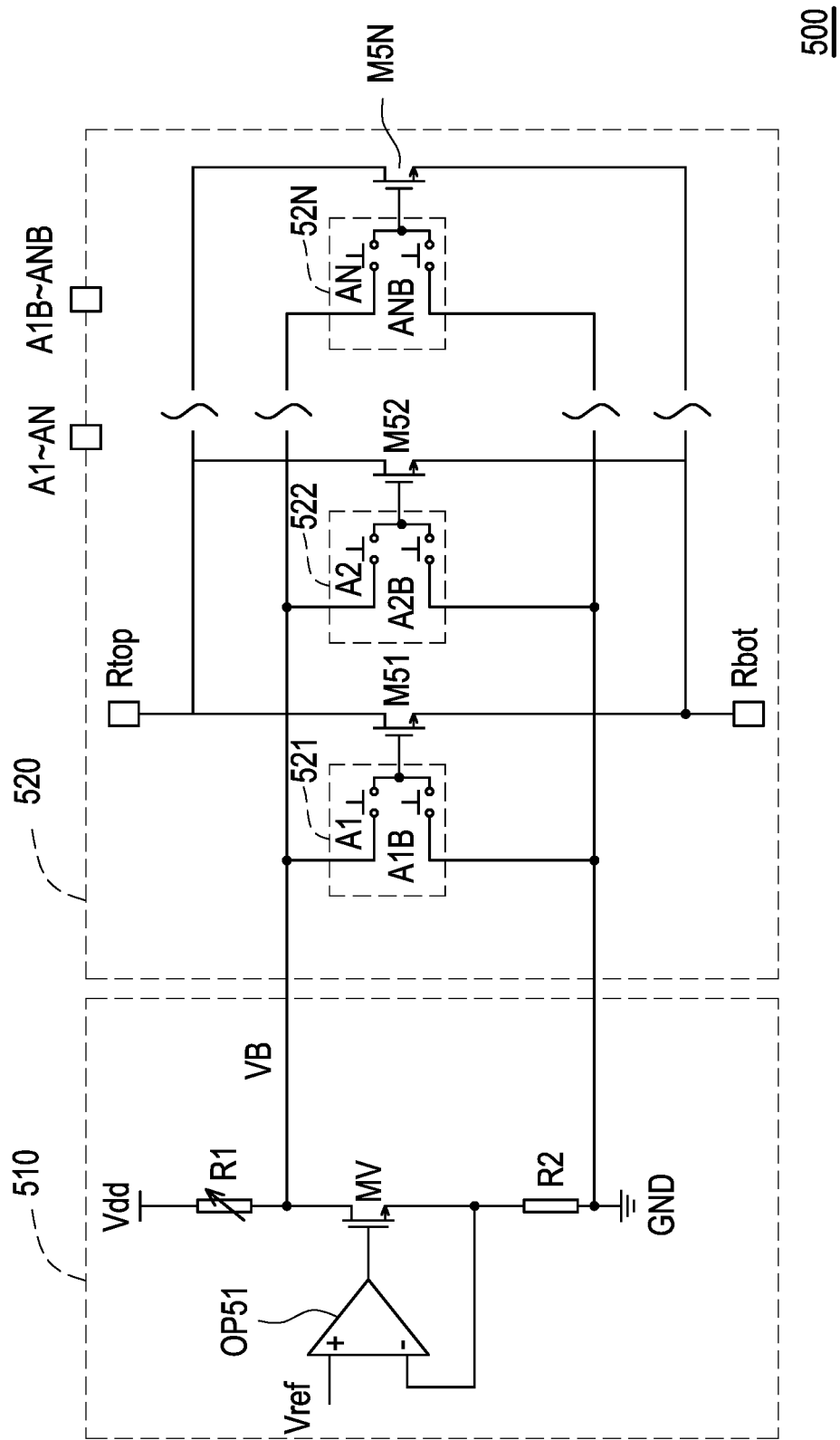
FIG. 5 is a schematic diagram of an implementation of a variable resistor in a zero-crossing detection circuit of an embodiment of the invention.

Referring to FIG. 5, FIG. 5 is a schematic diagram of an implementation of a variable resistor in a zero-crossing detection circuit of an embodiment of the invention. A variable resistor 500 includes a bias generator 510, a plurality of transistors M51 to M5N, and a plurality of bias selectors 521 to 52N. The bias generator 510 provides a bias voltage VB to the bias selectors 521 to 52N. The bias selectors 521 to 52N also receive the reference ground voltage $V_{GND}$ and selection signals A1 to AN and AB1 to ABN respectively. The bias selectors 521 to 52N correspond to the transistors M51 to M5N respectively and according to the selection signals A1 to AN and AB1 to ABN, and respectively selects to provide the bias voltage VB or the reference ground voltage $V_{GND}$ to the control terminals of the corresponding transistors M51 to M5N. The transistors M51 to M5N are connected in parallel between a first terminal Rtop and a second terminal Rbot of the variable resistor 500.

In the present embodiment, when each of the transistors M51 to M5N receives the bias voltage VB, each of the transistors M51 to M5N may be operated in the linear region and provide a resistance value. In contrast, when each of the transistors M51 to M5N receives the reference ground voltage $V_{GND}$, each of the transistors M51 to M5N may be cut off. Therefore, the number of the transistors M51 to M5N operated in the linear region may be adjusted by selecting the signals A1 to AN and AB1 to ABN, thereby adjusting the resistance value of the variable resistor 500.

Moreover, the bias generator 510 includes an operational amplifier OP51, resistors R1 and R2, and a transistor MV. The resistors R1 and R2 and the transistor MV are connected in series between the power supply voltage Vdd and the ground GND. The positive input terminal of the operational amplifier OP51 receives a reference voltage Vref; the negative input terminal of the operational amplifier OP51 is coupled to the second terminal of the transistor MV; and the output terminal of the operational amplifier OP51 is coupled to the control terminal of the transistor MV. The voltage on the coupling terminal of the resistor R2 and the transistor MV may be equal to the reference voltage Vref, and may limit the drain-source current of the transistor MV. By making the current generated by the transistor MV flow through the resistor R1, the bias voltage VB is generated.

In the present embodiment, the magnitude of the bias voltage VB may be used to control the resistance value provided by each of the transistors M51 to M5N. The reference voltage Vref may be the output voltage of the voltage converter. In this way, the variable resistor 500 may track the output voltage of the voltage converter to adjust the provided resistance value, effectively improving the accuracy of the detection action of the zero-crossing detection circuit.

Please note that in the present embodiment, the transistors M51 to M5N are coupled to each other in parallel. In other embodiments of the invention, the transistors M51 to M5N may also be coupled to each other in a series manner, or partially in parallel and partially in series. That is, the implementation of FIG. 5 is only an example for illustration, and those of ordinary skill in the art may connect the transistors M51 to M5N in any manner without fixed limitations. In addition, in the present embodiment, the transistors M51 to M5N are N-type transistors. In other embodiments, the transistors M51 to M5N may also be P-type transistors, without certain limitations.

It should be mentioned that, the operational amplifier mentioned in an embodiment of the invention may be implemented using a folded cascode amplifier or any operational amplifier well known to those of ordinary skill in the art, without specific limitations.

According to the above, in the zero-crossing detection circuit of an embodiment of the invention, via the first stage, the comparator sets the reference voltage according to the voltage on the first terminal of the memorized first transistor, and in the second stage, a comparing action of the voltage on the second terminal of the variable resistor and the reference voltage is performed via the comparator to perform a detecting action of the zero-crossing point of the switching voltage. Furthermore, the zero-crossing detection circuit of an embodiment of the invention may adjust the detection time point by adjusting the resistance value of the variable resistor, and flexibly track the output voltage of the power converter in real time, thus further improving the accuracy of zero-crossing detection.

Lastly, it should be noted that the above embodiments are used to describe the technical solutions of the disclosure instead of limiting them. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

What is claimed is:

1. A zero-crossing detection circuit, comprising:
   a variable resistor having a first terminal to be connected to a power supply voltage via a reference resistor;
   a first switch having a first terminal coupled to a first terminal of the variable resistor;
   a first capacitor having a first terminal coupled to a second terminal of the first switch;
   a first selector making a second terminal of the first capacitor receive a switching voltage or a reference ground voltage according to a first control signal;

a first transistor having a first terminal coupled to a second terminal of the variable resistor, wherein a second terminal of the first transistor receives the reference ground voltage;

a second selector coupling a control terminal of the first transistor to the first terminal of the first transistor or to the first terminal of the first capacitor according to the first control signal; and a comparator comparing a voltage on the second terminal of the variable resistor with a zero-crossing detection reference voltage to generate a final zero-crossing detection output signal.

2. The zero-crossing detection circuit of claim 1, wherein in a first control phase, the first switch is turned on, the second selector couples the first terminal of the first transistor to the control terminal of the first transistor, and the first selector makes the second terminal of the first capacitor receive the reference ground voltage.

3. The zero-crossing detection circuit of claim 2, wherein in the first control phase, the comparator is configured as a voltage buffer and generates the zero-crossing detection reference voltage according to a voltage on the first terminal of the first transistor.

4. The zero-crossing detection circuit of claim 2, wherein in a second control phase, the first switch is cut off, the second selector couples the control terminal of the first transistor to the first terminal of the first capacitor, and the first selector makes the second terminal of the first capacitor receive the switching voltage.

5. The zero-crossing detection circuit of claim 4, wherein in the second control phase, the comparator eliminates an offset error and generates the final zero-crossing detection output signal.

6. The zero-crossing detection circuit of claim 4, wherein the first control phase and the second control phase occur alternately.

7. The zero-crossing detection circuit of claim 1, wherein the first selector comprises a second switch and a third switch, the third switch is coupled to the second terminal of the first capacitor and the switching voltage of the zero-crossing detection circuit, and the second switch is coupled between the second terminal of the first capacitor and the reference ground voltage, wherein the second switch is controlled by a first sub-control signal, and the third switch is controlled by a second sub-control signal.

8. The zero-crossing detection circuit of claim 7, wherein the first selector comprises a fourth switch and a fifth switch, the fifth switch is coupled between the control terminal of the first transistor and the first terminal of the first transistor, and the fourth switch is coupled between the control terminal of the first capacitor and the first terminal of the first capacitor, wherein the fifth switch is controlled by the first sub-control signal, and the fourth switch is controlled by the second sub-control signal.

9. The zero-crossing detection circuit of claim 8, wherein the comparator comprises:

an operational amplifier having a positive input terminal to be coupled to the first terminal of the first transistor, wherein a negative input terminal of the operational amplifier is coupled to an output terminal of the operational amplifier, and the operational amplifier is configured as a voltage buffer to generate the zero-crossing detection reference voltage for a comparison in the comparator;

a second capacitor coupled between the negative input terminal of the operational amplifier and the reference ground voltage and storing the zero-crossing detection reference voltage generated by the voltage buffer; and a sixth switch coupled between the output terminal of the operational amplifier and the negative input terminal of the operational amplifier and controlled by the first sub-control signal.

10. The zero-crossing detection circuit of claim 9, further comprising:

an inverter coupled to the output terminal of the operational amplifier and generating the final zero-crossing detection output signal according to an output of the operational amplifier.

11. The zero-crossing detection circuit of claim 9, wherein the sixth switch is turned on in the first control phase and cut off in the second control phase.

12. The zero-crossing detection circuit of claim 9, wherein the sixth switch comprises a plurality of sub-switches connected in series.

13. The zero-crossing detection circuit of claim 9, further comprising:

a second transistor coupled between a second terminal of the second capacitor and a first reference ground terminal; and a third transistor coupled between the second terminal of the second capacitor and a second reference ground terminal, wherein on and off states of the second transistor and the third transistor are respectively the same as on and off states of the second switch and the third switch.

14. The zero-crossing detection circuit of claim 1, wherein the variable transistor comprises:

a bias voltage generator generating a bias voltage;

a plurality of second transistors coupled in parallel between the first terminal and the second terminal of the variable resistor; and a plurality of bias selectors respectively having different bias voltages corresponding to a plurality of transistors, wherein a programmable resistor of the bias selector changes the bias voltage according to a selection signal, or changes the reference voltage to be provided to a control terminal of the plurality of corresponding transistors.

15. The zero-crossing detection circuit of claim 14, wherein the bias generator comprises:

a first resistor and a second resistor coupled in series between the power supply voltage and the reference ground voltage;

a third transistor coupled between the first resistor and the second resistor; and an operational amplifier having a positive input terminal receiving an output voltage of a voltage converter, wherein a negative input terminal of the operational amplifier is coupled to a coupling terminal of the third transistor and the second resistor, and an output terminal of the operational amplifier is coupled to a control terminal of the third transistor.

* * * * *